United States Patent [19]

Fang et al.

[11] 4,326,208
[45] Apr. 20, 1982

[54] SEMICONDUCTOR INVERSION LAYER TRANSISTOR

[75] Inventors: Frank F. Fang, Yorktown Heights; George A. Sai-Halasz, Mt. Kisco, both of N.Y.

[73] Assignee: International Business Machines Corporation, Armonk, N.Y.

[21] Appl. No.: 134,235

[22] Filed: Mar. 26, 1980

[51] Int. Cl.³ .......................................... H01L 29/161
[52] U.S. Cl. ........................................ 357/16; 357/16; 357/89
[58] Field of Search ........................ 357/30, 17, 89, 16

[56] References Cited

U.S. PATENT DOCUMENTS 3,209,215  9/1965  Esaki ..................................... 357/16

OTHER PUBLICATIONS

Chang et al., *I.B.M. Tech. Discl. Bull.*, pp. 1689–1690, Sep. 1978.
Chang et al., *Appl. Phys. Lett.*, 35(12)15, Dec. 1979, pp. 939–942.
Chang et al., *I.B.M. Tech. Discl. Bull.*, vol. 21, No. 11, Apr. 1979, p. 4692.

*Primary Examiner*—Martin H. Edlow
*Attorney, Agent, or Firm*—Pollock, Vande Sande & Priddy

[57] ABSTRACT

A semiconductor inversion layer transistor which is compatible with semiconductor fabrication technology, and an integrated circuit which incorporates a plurality of such transistors. In one embodiment of the transistor, a P type indium arsenide base and a P type gallium antimonide emitter are used while the collector can be made of either P type gallium antimonide or N type indium arsenide. By the nature of the band alignment at the interface, the indium arsenide base has its Fermi level pinned in the conduction ban at the base-emitter junction and an assymetrically conducting charge barrier which is formed at this junction is preferential to injection of carriers flowing from the emitter to the base rather than vice versa. When the base-emitter junction is forward biased the electrons at the junction are projected across the base with minimal hole injection from base to emitter, thus providing a high gain transistor having excellent high frequency characteristics.

7 Claims, 4 Drawing Figures

SEMICONDUCTOR INVERSION LAYER TRANSISTOR

FIELD OF THE INVENTION

The present invention is directed to a semiconductor inversion layer transistor and to integrated circuitry incorporating such a transistor.

BACKGROUND OF THE INVENTION

An inversion layer transistor utilizing a semiconductor base in conjunction with a metal emitter and a metal collector is known in the prior art. In particular, Mead U.S. Pat. No. 3,289,052 discloses such a transistor in which a P type indium arsenide base separates metallic emitter and collector elements. Since indium arsenide has the property of having its Fermi level pinned in the conduction band near the semiconductor-metal interfaces, an accumulation of electrons at the interfaces create N type inversion layers thereat.

It is recognized that the highly inverted layers form barriers which are assymmetrically conducting, and the base-emitter barrier is lower for the passage of electrons from the metal to the base than for the passage of holes in the opposite direction. Thus, when the base-emitter interface is forward biased, the large number of electrons at the interface are projected into and across the base, thus providing a high emitter efficiency transistor having excellent high frequency characteristics.

Notwithstanding the advantageous speed of the above-described prior art transistor, to applicants knowledge it has not been developed commercially. It is believed that an important factor in the lack of commercial interest in the prior art transistor is the incompatability of the metal elements which it requires with current semiconductor fabrication technology.

In distinction thereto, the present invention provides an inversion layer transistor which retains all the advantages of the prior art device, but which, in addition, is made entirely of semiconductor material. Thus, unlike the prior art transistor, the transistor of the present invention may be epitaxially grown on semiconductor substrates, and therefore may be incorporated into integrated circuitry, such as for example very large scale integrated circuitry (VLSIC). Thus all of the ease, convenience and flexibility of working with semiconductor materials as well as the highly developed fabrication techniques associated therewith attach to the present invention. Further, better product uniformity and material quality is obtained with the present transistor and integrated circuits incorporating it, than with the metal-emitter transistor of the prior art.

SUMMARY OF THE INVENTION

It is therefore an object of the invention to provide an inversion layer transistor which is made of semiconductor material.

It is a further object of the invention to provide integrated circuitry which incorporates a plurality of inversion layer transistors.

It is still a further object of the invention to provide an inversion layer transistor having improved product uniformity and material quality.

It is still a further object of the invention to provide an inversion layer transistor having reduced contact resistance at the base-emitter and base-collector junctions.

It is still a further object of the invention to provide a semiconductor transistor in which both the base and emitter are doped with either acceptor or donor impurities.

The above objects are accomplished by recognizing that minority carrier injection can be attained at a junction comprised of two different semiconductor materials if the Fermi level of one is in the conduction band of that material and the conduction band overlaps the valence band of the other material at the junction, or alternatively if the Fermi level of one is in the valence band and the valence band overlaps the conduction band of the other material at the junction. One known combination of semiconductor materials for which these conditions exist are indium arsenide and gallium antimonide, e.g. see Optical Absorption of $In_{1-x}Ga_xAs$-$GaSb_{1-y}As_y$ Superlattices, by G. A. Sai Halasz, et al, Vol. 27, pp. 935-937, Solid State Communications, Pergamon Press Ltd. 1978. However, the condition may exist for other combinations of materials also, and it is intended that such other combinations shall fall within the scope of the present invention.

In accordance with one embodiment of the present invention a transistor utilizing a P type indium arsenide base and a P type gallium antimonide emitter is provided. The relative positioning of the bandedges of the two materials requires valence electrons from the gallium antimonide to be transferred to the indium arsenide side to form the inversion layer at the interface. Upon the application of forward bias, the electrons are injected to the P region of indium arsenide as minority carriers, thus causing the transistor to conduct.

In this embodiment, the collector may also be made of P type gallium antimonide in which case the base-collector junction is also assymmetrically conducting and is bidirectional. If there is no requirement that the transistor be bidirectional, the collector may be made of N type indium arsenide.

In accordance with another embodiment of the invention, the base may be made of N type gallium antimonide while the emitter is made of N type indium arsenide. Minority injection is as described above, except that in this embodiment, the minority carriers are holes. The collector may be made of N type indium arsenide or of P type gallium antimonide.

The transistors of the invention while retaining all of the advantages of the prior art metal-emitter inversion transistor such as high speed, narrow base width, reduced base resistance and the possibility of completely reversible operation if the transistor is bidirectional, also has the advantage of being compatible with current semiconductor fabrication technology. Thus, a plurality of transistors in accordance with the invention may, by known fabrications techniques, be incorporated into a single integrated circuit. Furthermore, this invention permits fabrication of complementary bipolar transistor LSI chips.

BRIEF DESCRIPTION OF THE DRAWINGS

The invention will be better understood by referring to the accompanying drawings in which.

DETAILED DESCRIPTION OF EMBODIMENTS OF THE INVENTION

Figure 1:
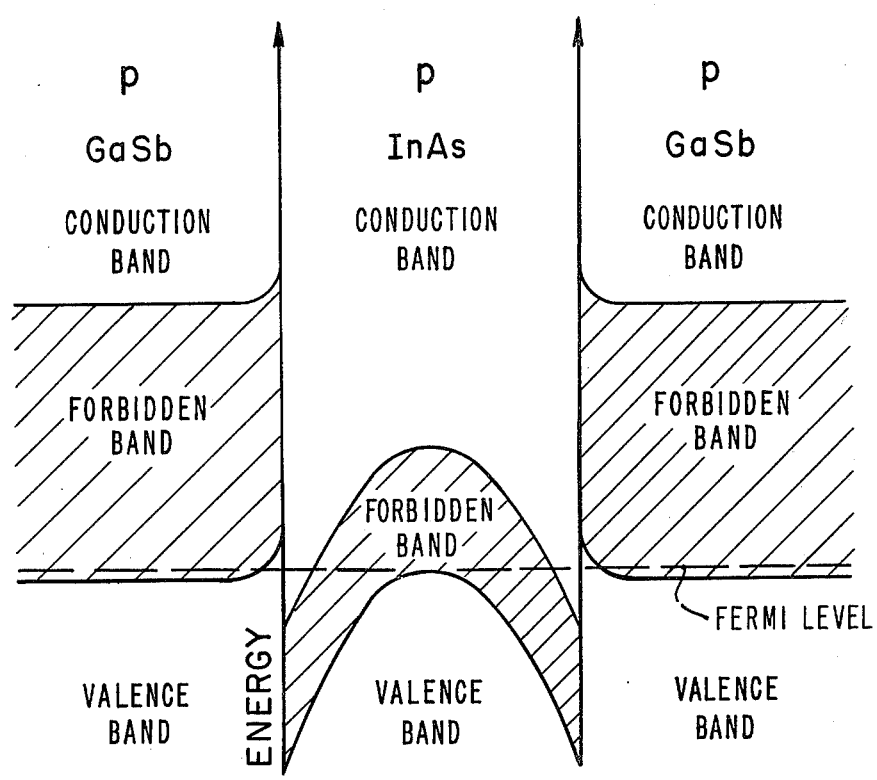
FIG. 1 is an energy band diagram of one embodiment of the transistor of the invention.

FIG. 1 is an energy band diagram of an embodiment of the invention which utilizes a P type indium arsenide base and a P type gallium antimonide emitter. Referring to the Figure, it is seen that the Fermi level of the indium arsenide base is in the conduction band near the base-emitter junction, and that a portion of the conduction band overlaps a portion of the valence band of the P type gallium antimonide emitter. This band gap overlap has been found to be approximately 0.19 ev. at room temperature.

Thus, an N type inversion layer of electrons is created in the P type indium arsenide base at the base-emitter junction, forming an assymmetrically conducting barrier which is preferential to the conduction of electrons from emitter to base rather than to the conduction of holes from base to emitter.

When the base-emitter junction is forward biased, electrons at the inversion layer are injected into the P type indium arsenide base region. The injected electrons will then diffuse through the base region and are collected at the base-collector junction, thus causing conduction of the transistor. The high mobility of electrons injected from the inversion layer causes the transistor to be very fast, and the speed is enhanced even further by the fact that the base can be made very narrow. Because the assymmetrically conducting barrier for electrons and holes at the base-emitter junction minimizes reverse injection of carriers, high emitter efficiency is provided. In the preferred embodiment, the base may be made as narrow as 500 A.U. or less.

If bidirectional operation is desired then the collector is made of P type gallium arsenide, in which case an inversion layer is formed at the base-collector junction as well as at the base-emitter junction. If bidirectional operation is not required, the collector may be made of N type indium arsenide or metal.

As discussed above, in a further embodiment of the invention, the base could be N type gallium antimonide while the emitter would be N type indium arsenide. Transistor action would be similar to that described above except that the carriers would be holes; the collector would be either N type indium arsenide for a bidirectional transistor, or P type gallium antimonide or metal for unidirectional operation.

Figure 2:
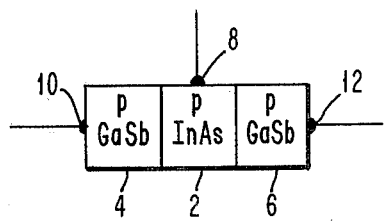
FIG. 2 is a schematic representation of a possible physical embodiment of the invention.

FIG. 2 is a schematic representation of a discrete embodiment of the transistor of the invention and depicts base 2, emitter 4, and collector 6, having respective electrodes 8, 10 and 12 associated therewith. FIG. 2 is intended to be illustrative only, and of course other designs are possible and are intended to be within the scope of the invention.

Figure 3:
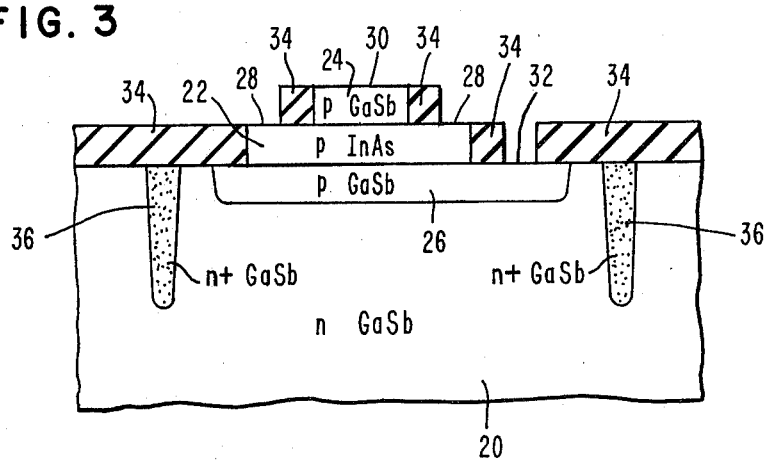
FIG. 3 is a cross-sectional view of a portion of an integrated circuit in accordance with the invention.
Figure 4:
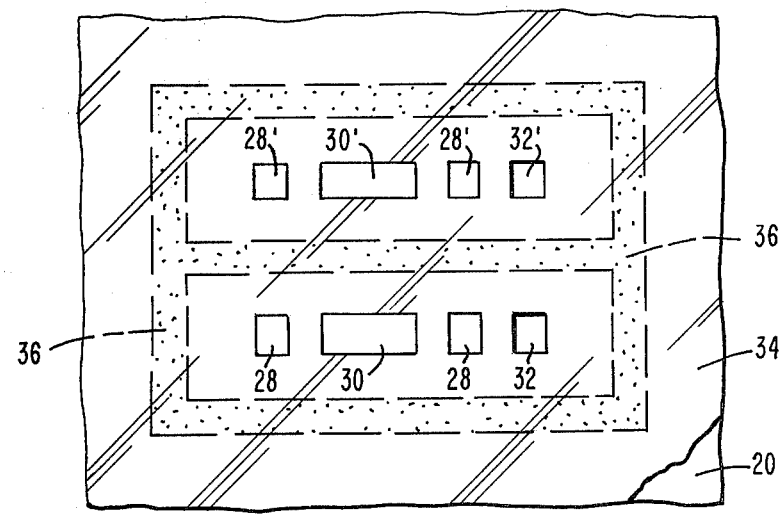
FIG. 4 is a top view of the integrated circuit of FIG. 3.

FIG. 3 is a cross-sectional view of an embodiment of an integrated circuit (VLSIC) in accordance with the invention which incorporates a plurality of transistors as described above, and FIG. 4 is a top view of the integrated circuit. It should be appreciated that the configuration depicted in FIGS. 3 and 4 is illustrative only, and that other specific integrated circuit arrangements may be utilized.

As may be seen by referring to these Figures, in the illustrative embodiment the transistors are disposed in a N type gallium antimonide antimonide substrate 20 and each is comprised of a P type indium arsenide base 22 and a P type gallium antimonide emitter 24 and collector 26 as described above. Contacts 28, 30 and 32 are disposed on the top surfaces of the respective elements and oxide 34 or another insulator is used to separate the elements of adjacent transistors from each other at the surface while guard rings 36 of N+ type material prevent cross-talk between adjacent transistors within the body of the integrated circuit. While only two transistors are shown in the portion of the integrated circuit depicted, using state of the art fabrication techniques a very large number of such transistors could be fabricated in a physically small in tegrated circuit.

As mentioned above, N type indium arsenide could be used for the collector instead of the P type gallium antimonide shown, and in this case, the substrate would be P type indium arsenide while P+ guard rings would be used. The integrated circuit substrate 20 is of some non-critical thickness, and the base, emitter and collector of the transistors would typically be order of magnitudes thinner.

The integrated circuit of the invention may be fabricated in accordance with well-known semiconductor fabrication techniques. For example, the first step might be to define a plurality of regions in the substrate where it is desired for the transistors to be located by creating a plurality of adjacent guard rings by conventional doping techniques. Next, the collectors of the transistors would be formed, again by doping, and masking techniques would be utilized to define the positions of the transistor bases, after which the base material would be epitaxially grown on the collectors by some known technique such as molecular beam epitaxy. Either during or after growth, the bases would be doped with appropriate dopants, and after this the collector material would be epitaxially deposited on the bases, and again would be doped either during or after growth. Deposition of oxide layers would be effected at appropriate times during the fabrication process, and as a last step, metallic electrodes would be deposited onto the transistor elements.

It should be understood that the fabrication techniques described above are illustrative only and are not intended to be exhaustive, and that semiconductor fabrication methods which are not mentioned may be utilized as well.

There thus has been disclosed a semiconductor inversion layer transistor which is advantageous in that it retains the assets of prior art inversion layer transistors while being compatible with current semiconductor fabrication technology, and an integrated circuit which incorporates a plurality of such transistors.

There further has been disclosed a unique semiconductor transistor in which both the base and emitter are doped with the same conduction type of impurities.

Further, it should be understood that while we have described certain embodiments of the invention, we do not intend to be restricted thereto, but rather intend to cover all variations and modifications which come within the spirit of the invention, which is limited only by the claims which are appended hereto.

We claim:

1. A semiconductor transistor which is comprised of a semiconductor base which is disposed between and which forms respective junctions with a semiconductor emitter and a semiconductor collector, all of said base, emitter and collector being doped with one of donors or acceptors and said junctions having charge barriers associated therewith, at least the base-emitter charge barrier being assymmetrically conducting with respect to electrons and holes respectively, and said emitter and base being of respective semiconductor materials such that the Fermi level in the base is above the conduction band edge or below the valence band edge of said semiconductor material at the base-emitter junction but is in the forbidden band in the interior of the base, whereby an inversion layer is formed in the base at said base-emitter junction.

2. The transistor of claim 1, wherein said base and emitter are either comprised of indium arsenide and gallium antimonide respectively or of gallium antimonide and indium arsenide respectively.

3. The transistor of claim 2, wherein said base is comprised of P type indium arsenide and said emitter is comprised of P type gallium antimonide.

4. The transistor of claim 3, wherein said base-collector junction is also assymmetrically conducting with respect to electrons and holes respectively.

5. The transistor of claim 4, wherein said collector is comprised of P type gallium antimonide.

6. The transistor of claim 4, wherein the collector is comprised of N type indium arsenide.

7. An integrated circuit comprising a plurality of transistors as recited in claim 2, which are epitaxially grown on a semiconductor substrate.

* * * * *